(12) United States Patent
Grange et al.

(10) Patent No.: US 7,671,429 B2
(45) Date of Patent: Mar. 2, 2010

(54) MICRO-MECHANICAL DEVICE COMPRISING SUSPENDED ELEMENT WHICH IS CONNECTED TO A SUPPORT BY MEANS OF A PIER AND PRODUCING METHOD THEREOF

(75) Inventors: Hubert Grange, Grenoble (FR); Murielle Moreau, Sassenage (FR); Michel Borel, Saint Vincent de Mercuze (FR)

(73) Assignee: Commissariat a l'Energie Atomique, Paris (FR)

( * ) Notice: Subject to any disclaimer, the term of this patent is extended or adjusted under 35 U.S.C. 154(b) by 905 days.

(21) Appl. No.: 10/567,865

(22) PCT Filed: Aug. 24, 2004

(86) PCT No.: PCT/FR2004/002184

§ 371 (c)(1),
(2), (4) Date: Feb. 10, 2006

(87) PCT Pub. No.: WO2005/023698

PCT Pub. Date: Mar. 17, 2005

(65) Prior Publication Data

US 2006/0283272 A1 Dec. 21, 2006

(30) Foreign Application Priority Data

Aug. 29, 2003 (FR) .................................. 03 10303

(51) Int. Cl.
*H01L 29/82* (2006.01)

(52) U.S. Cl. ..................................................... 257/415

(58) Field of Classification Search .......... 257/415–420, 257/E29.105
See application file for complete search history.

(56) References Cited

U.S. PATENT DOCUMENTS

| 5,334,342 | A | 8/1994 | Harker et al. |
| 6,240,782 | B1 | 6/2001 | Kato et al. |
| 6,566,725 | B1 * | 5/2003 | Lebouitz ..................... 257/467 |
| 7,492,019 | B2 * | 2/2009 | Carley ........................ 257/415 |
| 2002/0033453 | A1 | 3/2002 | Sauer et al. |
| 2002/0086540 | A1 | 7/2002 | Lebouitz |
| 2003/0071330 | A1 | 4/2003 | Romano et al. |

FOREIGN PATENT DOCUMENTS

| EP | 1 304 768 A2 | 4/2003 |
| WO | WO 01/09579 A1 | 2/2001 |

\* cited by examiner

*Primary Examiner*—Cuong Q Nguyen
(74) *Attorney, Agent, or Firm*—Oliff & Berridge, PLC

(57) ABSTRACT

A cavity is etched in a substrate and opens out onto the surface of the substrate facing the suspended element (1). The cavity has at least one broader zone having a cross-section which is greater than the cross-section of the cavity at said surface. A base (4) of the pillar (2), of complementary shape to the cavity, is buried in the cavity. The base (4) of the pillar (2) can form a dovetail assembly with the cavity of the substrate. This assembly is obtained by deposition, on a surface of the substrate, of a sacrificial layer and etching, in the sacrificial layer, of a hole passing through the sacrificial layer and reaching the surface of the substrate. The substrate is then etched, in the extension of the hole, so as to form the cavity of the substrate. Then a material designed to form the pillar (2) is deposited in the cavity and on the walls of the hole.

10 Claims, 6 Drawing Sheets

MICRO-MECHANICAL DEVICE COMPRISING SUSPENDED ELEMENT WHICH IS CONNECTED TO A SUPPORT BY MEANS OF A PIER AND PRODUCING METHOD THEREOF

BACKGROUND OF THE INVENTION

The invention relates to a micro-mechanical device comprising at least one suspended element attached to a support by a pillar comprising a base and a top.

STATE OF THE ART

Micro-mechanical systems, for example acceleration sensors, conventionally comprise mobile or fixed suspended elements. These micro-systems are used in particular in automobile applications, for suspension correction, for driving assistance and for opening air-bags, requiring an acceleration measurement comprised between 0 and 25 g. Acceleration sensors are also used in pace-makers, requiring an acceleration measurement comprised between 0 and 2 g.

As represented in FIG. 1, a suspended element 1 is conventionally fixed, by a pillar 2, to a support 3. Current methods for fixing the suspended element 1 to the support 3 consist in growing thin layers on the support 3, to form the pillar 2 and the suspended element 1. Thus, the pillar respectively comprises a base 4 in contact with the support 3 and a top 5 in contact with the suspended element 1. The mechanical tensile strength of the suspended element 1 with respect to the support 3 is ensured by the adhesion of the materials at the interfaces, in particular at the interface between the material of the suspended element 1 and the material of the pillar 2 at the top 5 of the pillar on the one hand, and at the interface between the material of the support 3 and the material of the pillar 2 at the base 4 of the pillar on the other hand. These methods are for example used for growth of a pillar 2 made of electrically insulating material, for example silicon nitride (SiN), on a silicon (Si) support 3. The mechanical strength between these materials may be insufficient, in particular in the case where over-pressures are applied in the Microsystems, for example in the case of systems where it is required to dampen the vibrations of the suspended element 1 or in flowmeters.

OBJECT OF THE INVENTION

The object of the invention is to remedy these drawbacks and, in particular, to increase the mechanical strength of micromechanical systems comprising a suspended element.

According to the invention, this object is achieved by the appended claims and more particularly by the fact that the support comprises a cavity etched in a substrate and opening out on the surface of the substrate facing the suspended element, the cavity having at least one broader zone having a cross-section which is greater than the cross-section of the cavity at said surface, the base of the pillar, of complementary shape to the cavity, being buried in the cavity.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
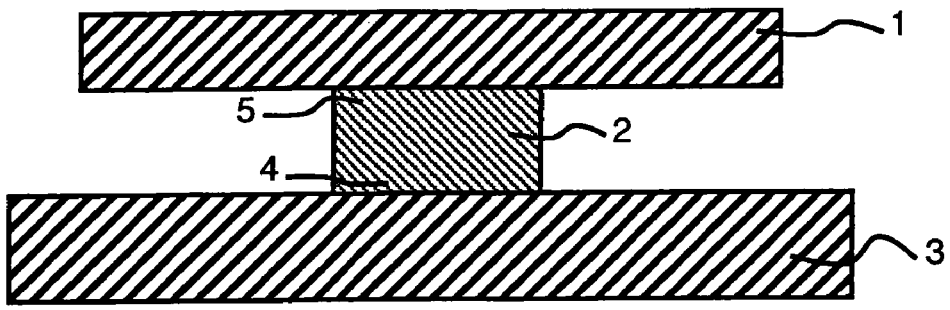
FIG. 1 represents a device according to the prior art.
Figure 2:
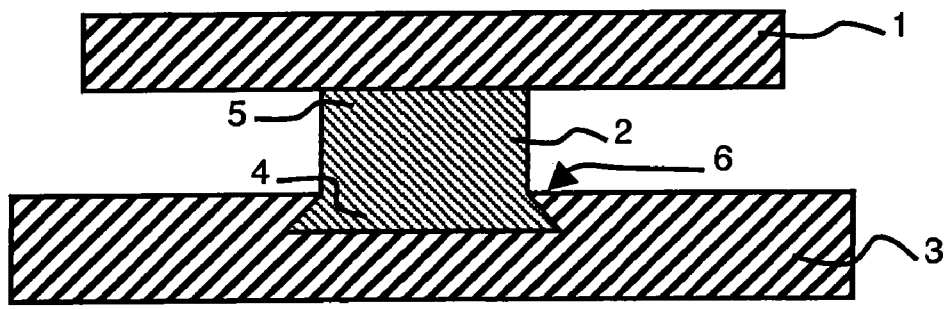
FIGS. 2 and 3 represent particular embodiments of the device according to the invention.

In the micro-mechanical device represented in FIG. 2, the base 4 of the pillar 2 is buried in a complementary cavity 6 of the support 3 and comprises, in the cavity 6 of the support 3, a zone of broader cross-section, preferably forming a nail heading or dovetail assembly with the cavity 6 of the support 3. Anchoring of the pillar 2 in the support 3 is therefore stronger than conventional anchoring by adhesion. The material designed to form the pillar 2 can be a conducting material, for example silicon, or an insulating compound of the SiN type.

Figure 3:
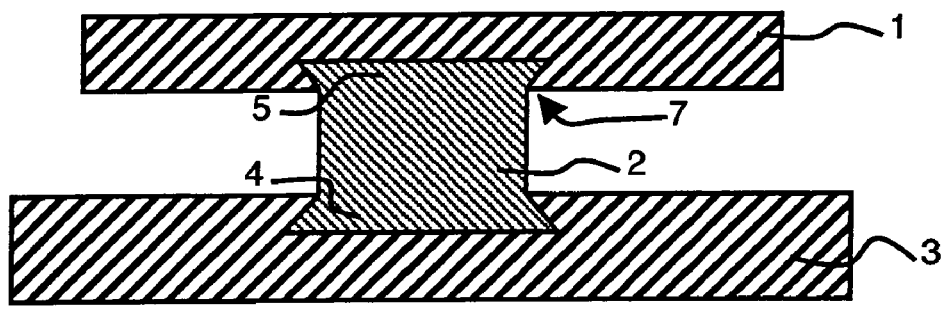

In FIG. 3, the top 5 of the pillar 2 is also buried in a complementary first cavity 7 of the suspended element 1. The top 5 of the pillar 2 comprises a zone of broader cross-section, in the first cavity 7 of the suspended element 1, forming for example a nail heading or dovetail assembly with the first cavity 7 of the suspended element 1. Anchoring of the suspended element 1 on the support 3 therefore also presents a good mechanical strength.

Figure 4:
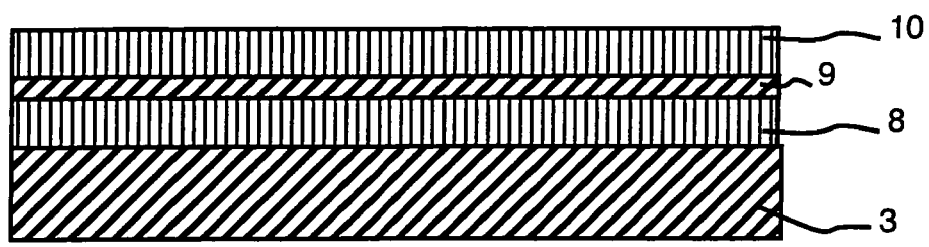
FIGS. 4 to 12 represent the successive steps of a particular embodiment of the method according to the invention, the material designed to form the pillar being deposited on the walls of the hole without filling the hole.

A production method of the device, illustrated in FIGS. 4 to 12, comprises conventional steps, for example depositions and etchings of thin layers, and special etching steps generating for example oblique etching sides. As represented in FIG. 4, a sacrificial layer 8, a solid layer 9 and an additional sacrificial layer 10 are successively deposited on a surface of the support 3 which is preferably made of silicon. The thickness of the sacrificial layer 8 determines the final distance between the support 3 and the suspended element 1. For example, the thicknesses of the layers are respectively 2 μm for the sacrificial layer 8, 320 nm for the solid layer 9 and 70 nm for the additional sacrificial-layer 10. The sacrificial layers 8 and 10 are preferably-made of silica and the solid layer 9 of silicon. Stacking of the layers can for example be performed from silicon on insulator (SOI) type substrates having a layer of $SiO_2$ arranged between a layer of silicon and a silicon substrate.

Figure 5:
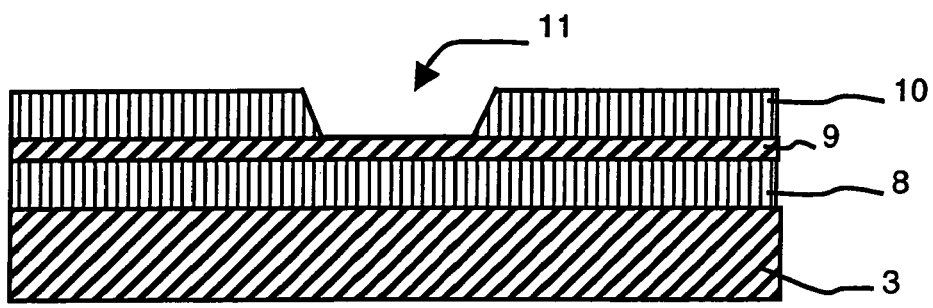
Figure 6:
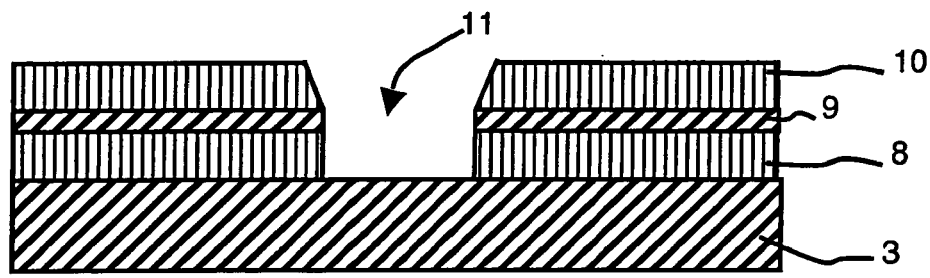

Then a hole 11 is etched in the stacking formed by the additional sacrificial layer 10, the solid layer 9 and the sacrificial layer 8 (FIGS. 5 and 6). As represented in FIG. 5, the additional sacrificial layer 10 can be etched creating oblique etching sides in the additional sacrificial layer 10, so that the top part of the hole 11 tapers downwards and thus forms a broader zone in the top part of the additional sacrificial layer 10. Etching of the additional sacrificial layer 10 can be performed by wet etching, for example using hydrofluoric acid-based solutions and a photoresist mask, or by isotropic dry plasma etching using $SF_6$.

As represented in FIG. 6, the solid layer 9 and sacrificial layer 8 can be etched so as to create etching sides substantially perpendicular to the layers 8 and 9. The hole 11 then passes through the whole of the sacrificial layer 8 and reaches the surface of the support 3, which corresponds for example to a depth of the hole of about 3 μm.

Figure 7:
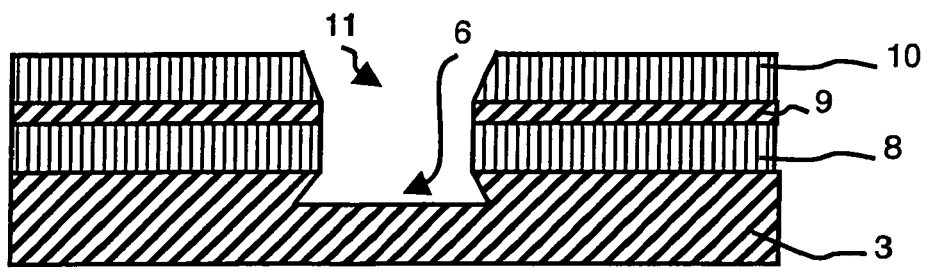

As represented in FIG. 7, the support 3 is then etched, in the extension of the hole 11, so as to form the dovetail-shaped cavity 6 of the support 3. The hole is thus broader in depth. Such an etching can in particular be performed by a plasma etching process described in the document U.S. Pat. No. 5,501,893. This process uses an alternation of two steps: a passivation step and an etching step. The passivation step consists in depositing a protective layer of polymer ($C_4F_8$-based) on the support 3 to be etched, in particular on the etching sides and bottom. The etching step uses an $SF_6$ plasma etching, which enables the polymer layer and the support 3 to be etched. An electric voltage applied to the support 3 accelerates the $SF_6$ ions in the direction of the support 3, amplifying etching in the bottom, whereas the sides are protected by the protective polymer layer. The etched cavity 6 is thus broader in depth than at the surface of the support 3. Adjustment of the etching and passivation parameters, in particular the pressure, flow rate and cycle time of the reactive gases, for example $SF_6$ and $C_4F_8$, and the voltage applied to the silicon support, enable vertical etched sides to be obtained. But the etched cavity 6 is broader in depth than at the surface of the support 3. This shape with a negative slope can be obtained by adjusting several parameters, for example by increasing the etching time compared with the passivation time or by adjusting the pressures and/or the electric voltage applied to the support 3.

Figure 8:
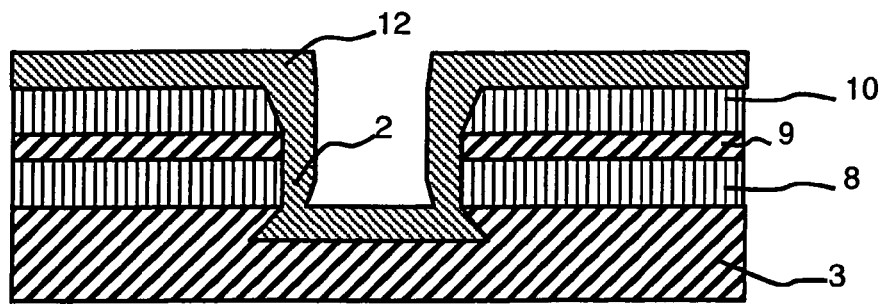
Figure 9:
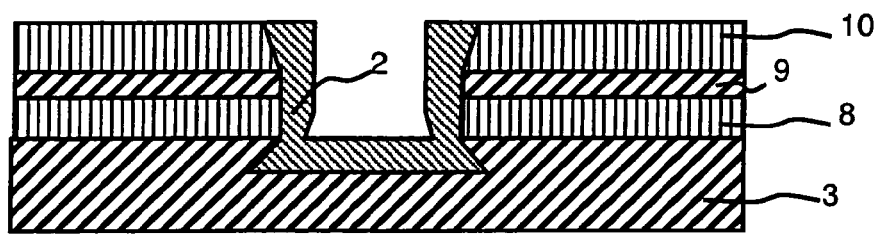
Figure 10:
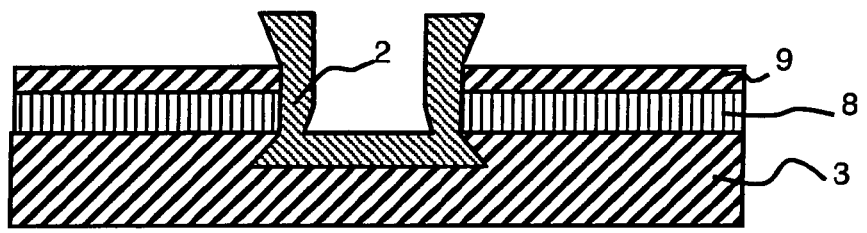

After the cavity 6 of the support 3 has been etched, a material 12, designed to form the pillar 2 is deposited in the cavity 6 of the support 3 and at least on the walls of the hole 11 (FIG. 8). In FIG. 8, the material 12, which is preferably an electric insulator, for example SiN, is also deposited on the additional sacrificial layer 10. As represented in FIG. 9, the material 12 deposited on the additional sacrificial layer 10 can be eliminated by polishing or plasma etching.

Figure 11:
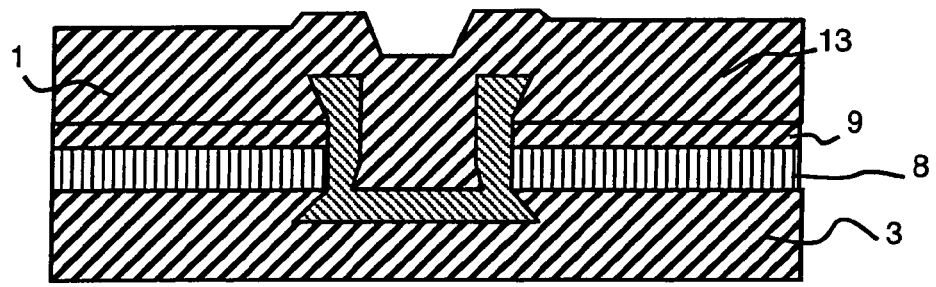
Figure 12:
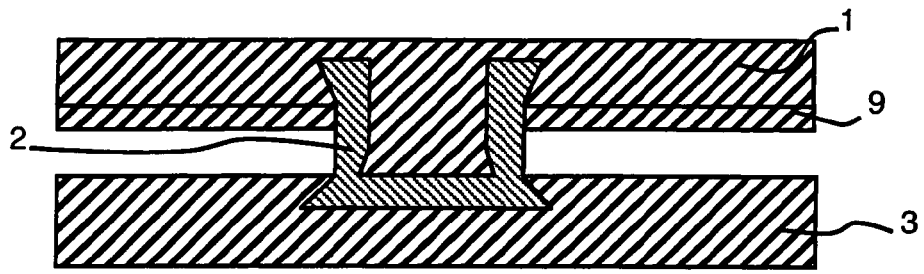

The additional sacrificial layer 10 is then eliminated, for example by wet etching, (FIG. 10) and a material 13, preferably Si, designed to form the suspended element 1, is deposited on the solid layer 9 and the material 12 forming the pillar 2 so as to fill the hole 11 (FIG. 11). The layer 9 also acts as support for the material 13, in particular in the case where the latter is deposited by epitaxy. The layer 9 is thus intimately bonded to the material 13 and forms the suspended element therewith. The material 13 can then be smoothed by polishing or etching and the sacrificial layer 8 is then removed (FIG. 12).

After etching of the sacrificial layer 8, the suspended element is then anchored on the support 3 by the pillar 2. The solidity of the anchoring does not depend only on the quality of the intrinsic adhesion of the materials, but it is enhanced by assembly with a zone of broader cross-section and for example of dovetail or nail heading type.

The embodiment represented in FIGS. 8 to 12 can for example be used to achieve a pillar 2 with an external lateral dimension of more than 2 μm and a layer of material 12 with a thickness of less than 1 μm. The layer of material 12 thus fills the cavity 6 and covers the walls of the hole 11, as represented in FIGS. 8 to 12.

In another embodiment, represented in FIGS. 13 to 17, the material 12 designed to form the pillar 2 can fill the hole 11 completely, which is for example the case when the external lateral dimension of the pillar 2 is smaller than half the thickness of the layer of material 12 forming the pillar 2.

Figure 13:
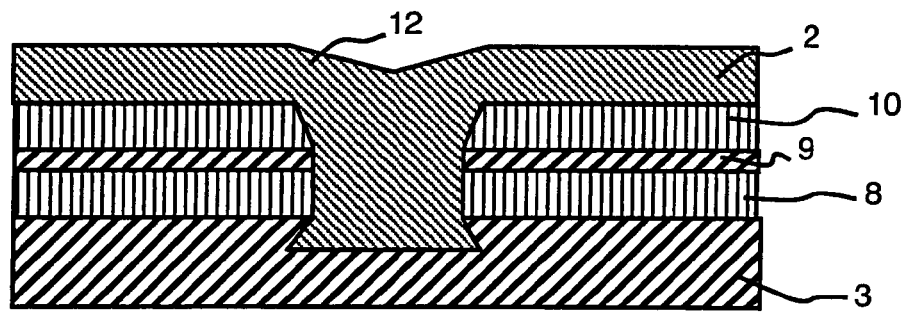
FIGS. 13 to 17 represent the successive steps of another particular embodiment of the method according to the invention, the material designed to form the pillar filling the hole.
Figure 14:
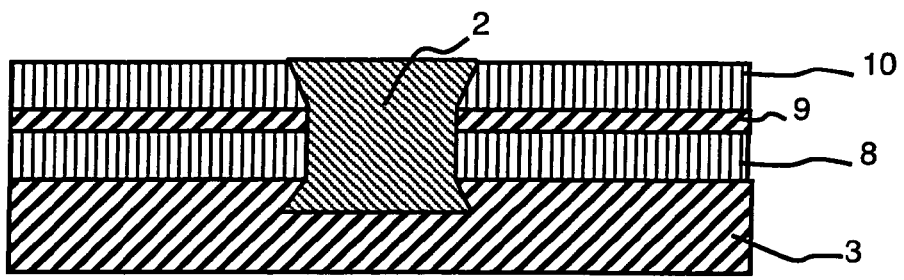
Figure 15:
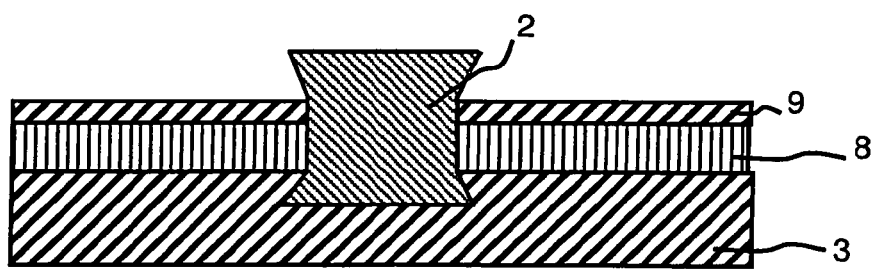
Figure 16:
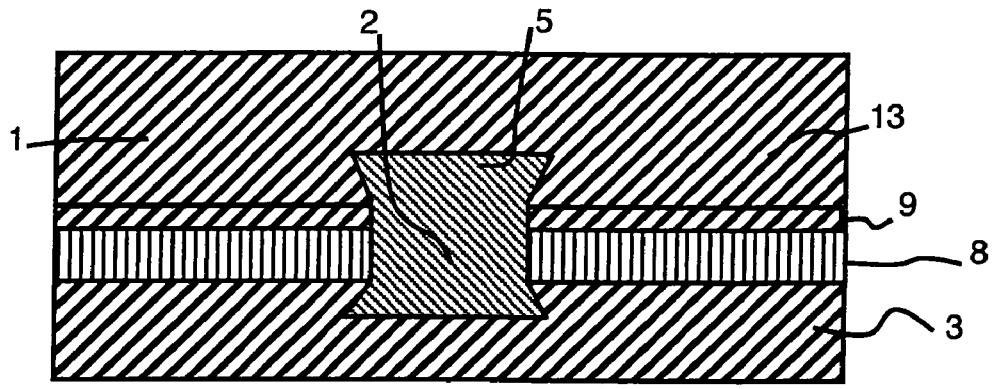

In FIG. 13, the insulating material 12 is deposited so as to fill the hole 11 and to cover the additional sacrificial layer 10.

Figure 17:
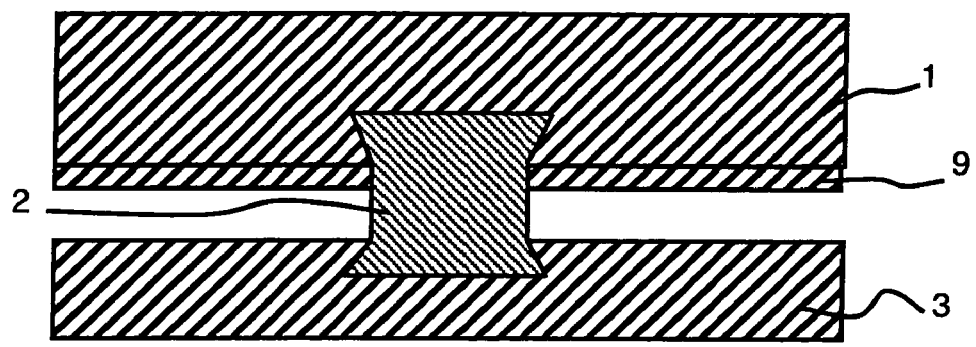

After the material 12 has been polished (FIG. 14) and the additional sacrificial layer 10 has been eliminated, for example by etching (FIG. 15), the material 13 designed to form the suspended element 1 can be deposited (FIG. 16) on the solid layer 9 and on the pillar 2 so as to form a dovetail assembly with the top 5 of the pillar 2. The sacrificial layer 8 can then be removed (FIG. 17).

Figure 18:
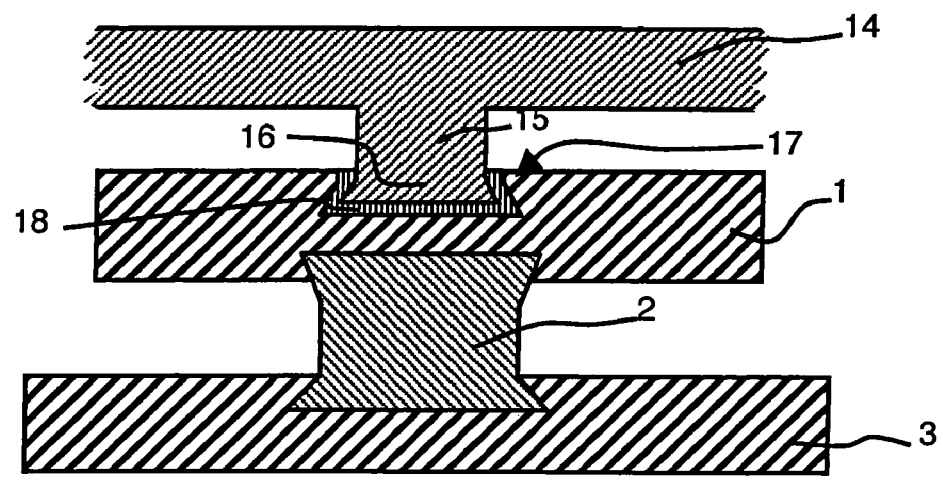
FIG. 18 represents a particular embodiment of the device according to the invention, comprising a cover integral to an additional pillar.

In the case where a cover 14 designed to cover all the fixed and movable parts of the device is added, the cover 14 can also be fixed to the suspended element 1 by means of a dovetail assembly. In FIG. 18, the device comprises a cover 14 integral to an additional pillar 15 perpendicular to the cover 14. A base 16 of the additional pillar 15, opposite the cover 14, is buried in a complementary second cavity 17 of the suspended element 1. The base 16 of the additional pillar 15 is broader in the second cavity 17 of the suspended element 1, preferably forming a dovetail assembly with the second cavity 17 of the suspended element 1.

The dovetail or nail heading assembly between the additional pillar 15 and the suspended element 1 can be achieved in the same way as the assembly between the support 3 and the pillar 2. The suspended element 1 is thus etched so as to form the second cavity 17 of the suspended element 1 in the form of a dovetail or nail heading. A material designed to form the base 16 of the additional pillar 15 is then deposited, at least in the second cavity 17 of the suspended element 1.

In a particular embodiment, the material constituting the base 16 of the additional pillar 15 integral to the cover 14 is an insulating material, for example SiN, to prevent electrical conduction between the cover 14 and the suspended element 1.

In another embodiment, an electrically insulating layer 18, for example made of SiN, can be deposited at the interface between the suspended element 1 and the additional pillar 15. In the case where an electrical continuity between the cover 14 and the suspended element 1 is not inconvenient or is even desirable, the layer 18 is not necessary.

According to the invention, the cavity 6 of the support 3 is etched in a substrate and opens out on the surface of the substrate facing the suspended element 1. As described previously, other layers can be deposited on the substrate forming the support. The cavity 6 has at least one broader zone the cross-section whereof is greater than the cross-section of the cavity 6 at said surface. In the embodiment previously described, this broader zone is formed in such a way that the base 4 of the pillar 2 and the cavity 6 of the support 3 constitute a dovetail assembly.

Figure 19:
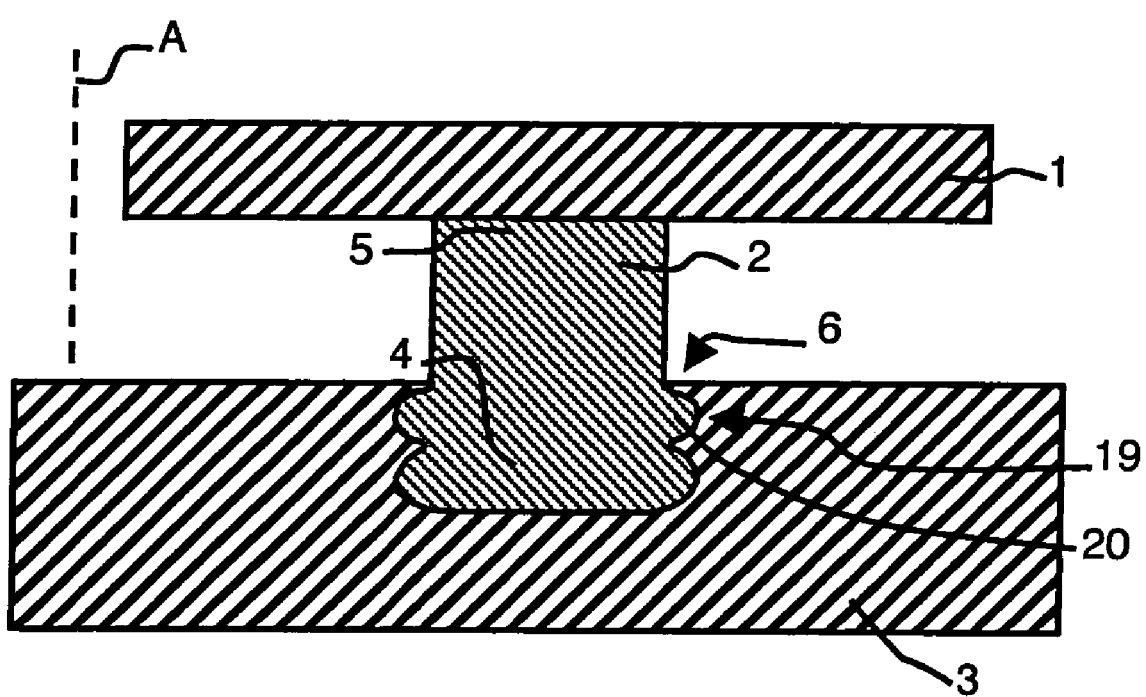
FIG. 19 represents another particular embodiment of the device according to the invention.

In the particular embodiment represented in FIG. 19, two broader zones of the cavity 6 are formed by two superposed grooves 19. The base 4 of the pillar 2 comprises at least two ribs 20 complementary to said grooves 19. For a cavity 6 with a diameter of about one micrometer, the height of one of the grooves 19 along an axis A perpendicular to the support 3 is preferably comprised between 0.27 and 0.34 micrometers. The depth of the grooves in the plane of the support 3 is preferably comprised between 0.1 and 0.3 micrometers. The number of grooves 19 can be more than two. A cavity 6 is thus obtained having sides that are substantially perpendicular to the support 3, the profile of the sides having an undulating shape corresponding to the grooves 19. In another embodiment, the sides are undulating as before and are inclined with respect to the support 3 so as to form a dovetail.

The grooves 19 can be achieved in known manner by a method using an alternation of a passivation step and an etching step, wherein the $C_4F_8$ content can be reduced or eliminated during the etching step using an $SF_6$ plasma. To form the pillar 2, the cavity 6 is preferably filled with silicon nitride SiN. Filling is complete and does not leave any empty space between the pillar 2 and the substrate. The pillar 2 of the device obtained is solidly anchored and breaks under the effect of a lateral force exerted on the pillar without the pillar 2 coming out of the cavity 6.

The invention claimed is:

1. Micro-mechanical device comprising at least one suspended element attached, the pillar comprising a base and a top, the support comprising a cavity etched in a substrate and opening out at the surface of the substrate facing the suspended element, the cavity having at least one broader zone having a cross-section which is greater than the cross-section of the cavity at said surface, the base of the pillar, of complementary shape to the cavity, being buried in the cavity, wherein at least two broader zones of the cavity are formed by at least two superposed grooves, the base of the pillar comprising at least two ribs complementary to said grooves.

2. Device according to claim 1, wherein the top of the pillar is buried in a complementary first cavity of the suspended element, the top of the pillar comprising a zone of broader cross-section in the first cavity of the suspended element.

3. Device according to claim 2, wherein the top of the pillar and the first cavity of the suspended element form a dovetail assembly.

4. Device according to claim 1, comprising a cover integral to an additional pillar, a base of the additional pillar, opposite the cover, being buried in a complementary second cavity of the suspended element, the base of the additional pillar comprising a zone of broader cross-section in the second cavity of the suspended element.

5. Device according to claim 4, wherein the base of the additional pillar and the second cavity of the suspended element form a dovetail assembly.

6. Device according to claim 4, comprising an electrically insulating layer arranged at the interface between the suspended element and the additional pillar.

7. Production method of a micro-mechanical device according to claim 1, comprising:
   deposition of at least one sacrificial layer on a surface of the support,
   etching, in the sacrificial layer, of a hole passing through the sacrificial layer and reaching the surface of the support,
   etching of the support, in the extension of the hole, so as to form the cavity of the support, said grooves being achieved by alternation of a passivation step by $C_4F_8$ and an etching step by $SF_6$ plasma,
   deposition of a material designed to form the pillar in the cavity of the support and at least on the walls of the hole.

8. Method according to claim 7, comprising:
   before etching of the hole, deposition of a solid layer and of an additional sacrificial layer on the sacrificial layer,
   etching of the hole being performed in the stacking formed by the additional sacrificial layer, the solid layer and the sacrificial layer, the hole comprising a broader zone in the additional sacrificial layer,
   elimination of the additional sacrificial layer after deposition of the material designed to form the pillar,
   deposition of a material forming the suspended element on the solid layer and the material forming the pillar,
   elimination of the sacrificial layer.

9. Method according to claim 8, comprising:
   etching of the suspended element so as to form a dovetail-shaped second cavity in the suspended element,
   deposition in the second cavity of the suspended element of a material designed to form the base of an additional pillar integral to a cover.

10. Method according to claim 7, wherein the material designed to form the pillar is deposited in such a way as to fill the hole.

* * * * *